United States Patent [19]

Kinoshita et al.

[11] Patent Number: 4,705,962
[45] Date of Patent: Nov. 10, 1987

[54] SOLID STATE DC RATE OF RISE CONTROLLED SWITCH

[75] Inventors: Roy Y. Kinoshita, Anaheim; Patrick E. McCollum; Mark E. Colan, both of Yorba Linda, all of Calif.

[73] Assignee: Rockwell International Corporation, El Segundo, Calif.

[21] Appl. No.: 918,235

[22] Filed: Oct. 14, 1986

[51] Int. Cl.⁴ .................... H03K 17/56; H03K 17/687
[52] U.S. Cl. ............................. 307/247.1; 307/254; 307/315; 307/570
[58] Field of Search .................. 307/247.1, 542.1, 254, 307/315, 570

[56] References Cited

U.S. PATENT DOCUMENTS 3,610,966 10/1971 Barber ............................. 307/542.1
3,663,950  5/1972 Bartlett ........................... 307/252 T Primary Examiner—Stanley D. Miller
Assistant Examiner—B. P. Davis
Attorney, Agent, or Firm—H. Frederick Hamann; George A. Montanye; James F. Kirk

[57] ABSTRACT

A solid state dc switch for switching power from the positive terminal of a ground referenced dc voltage source to the terminal of a ground referenced load. The solid state switch has a divide-by-two circuit means responsive to a clock signal and to a control signal first state for providing first and second symmetrical output signals at a frequency of one-half the frequency of said clock frequency. It also has a transformer drive and rectifier means for providing an isolated dc signal. An isolated switching means is included which is responsive to the high state of an isolated dc signal, having a transistor switch having a collector, an emitter and a base, the collector being coupled to a positive terminal of a ground referenced voltage source. The emitter is coupled to the return of the ground referenced load. The base is coupled to an isolated dc signal. The switching means is responsive to the change of state of the isolated dc signal from a low to a high state for limiting the rate of rise of voltage on a load to a predetermined limit subsequent to a change of state. The switching means is also responsive to the change of state of an isolated dc signal from a high state to a low state for limiting the rate of fall of voltage on a load subsequent to a change of state of an isolated dc signal from a high state to a low state.

9 Claims, 9 Drawing Figures

SOLID STATE DC RATE OF RISE CONTROLLED SWITCH

This invention was made with Government support under Contract No. N62269-85-C-0224 awarded by the Navy. The Goverenment has certain rights in this invention.

BACKGROUND OF THE INVENTION

1. Field of the Invention

This invention relates to the field of electrical switches and particularly to the field of remotely controlled electrical switches capable of interrupting the application of a source voltage to a load.

This invention relates more particularly to the field of solid state power controllers for dc (direct current) service or solid state electrical switches such as solid state relays for use in aircraft applications. Applications for the invention solid state dc switch include marine as well as aircraft and industrial applications that require noise-free closure and interruption of dc source power, compact size, extended switch life, low power dissipation, immunity to high vibration, mechanical shock and high reliability.

2. Description of the Prior Art

Electromechanical switching devices, such as relays, using solenoid-driven means to transfer electromechanical contacts to apply a source voltage to a load are well known. When coupled with an electromechanical circuit breaker, a relay provides a remotely controllable power control function capable of supplying ac or dc service to load via its closed contacts in series with an electromechanical circuit breaker. Electromechanical switching devices, such as relays, provide a very low voltage drop at the switch closure, thereby affording low power dissipation.

As used in dc power control applications, mechanical contacts cannot apply or remove power to a load free of bounce and arcing. Mechanical wear, electrical arcing and slow response also limit the application of electromechanical devices to applications requiring low closing cycle rates.

The solid state dc SWITCH is known to overcome the problem of contact bounce in applying a source voltage to a load. Solid state dc switches are also able to interrupt load current. However, solid state dc switches introduce a substantial voltage drop at the point of circuit closure, thereby providing relatively high power dissipation in comparison to electromechanical switching devices. Solid state dc switches find their greatest application in controlling electrical service to loads requiring relatively low load currents.

Environmental effects such as vibration, moisture, temperature and age, along with operational effects such as thermal and mechanical fatigue from past overload cycle experiences, contribute to the degradation of electromechanical switching of these assemblies. Contact arcing that is sustained by a high voltage source as the contacts separate contributes to electromechanical switch contact degradation, and produces transient noise disturbances that can contribute to error logic signal generation. In addition, mechanical switches provide no means for controlling the rate of rise of voltage on the load as the switch is closed. The closure of a mechanical switch in applying a dc source voltage to a load or to the service feeding a load can produce dv/dt rates of millions of volts per second. High dv/dt rates results in coupling noise spikes capacitively through the insulation of switched service, thereby interfering with other on-board electronics. The negative effect of the high voltage switch drop of a solid state dc switch is diminished by elimination of electromechanical switch contact degradation and transient noise disturbance in high voltage applications such as the 270 Vdc service proposed for avionics equipment in the 1990s.

SUMMARY OF THE INVENTION

It is an objective of this invention to provide a solid state switch that functions to switch dc power to a load in response to an input control signal assuming a first state and to interrupt power to the load in response to the input control signal assuming a second state.

Another objective of this invention is to limit contact arcing and contact bounce as the invention solid state dc switch applies or interrupts electrical service to a load in response to an input control signal.

It is another objective of this invention to provide a dc switch with rate of rise and fall control or fall and rise control that is independent of the load.

It is a further objective of this invention to provide an isolated switch capable of being interposed between the line service and the load or, in the alternative embodiment taught, being interposed between the load and the line service return or ground.

BRIEF DESCRIPTION OF THE DRAWINGS

The invention will be further described as to an illustrative embodiment in conjunction with the accompanying drawings in which.

DESCRIPTION OF THE PREFERRED EMBODIMENT

DC SWITCHING MEANS

Figure 1:
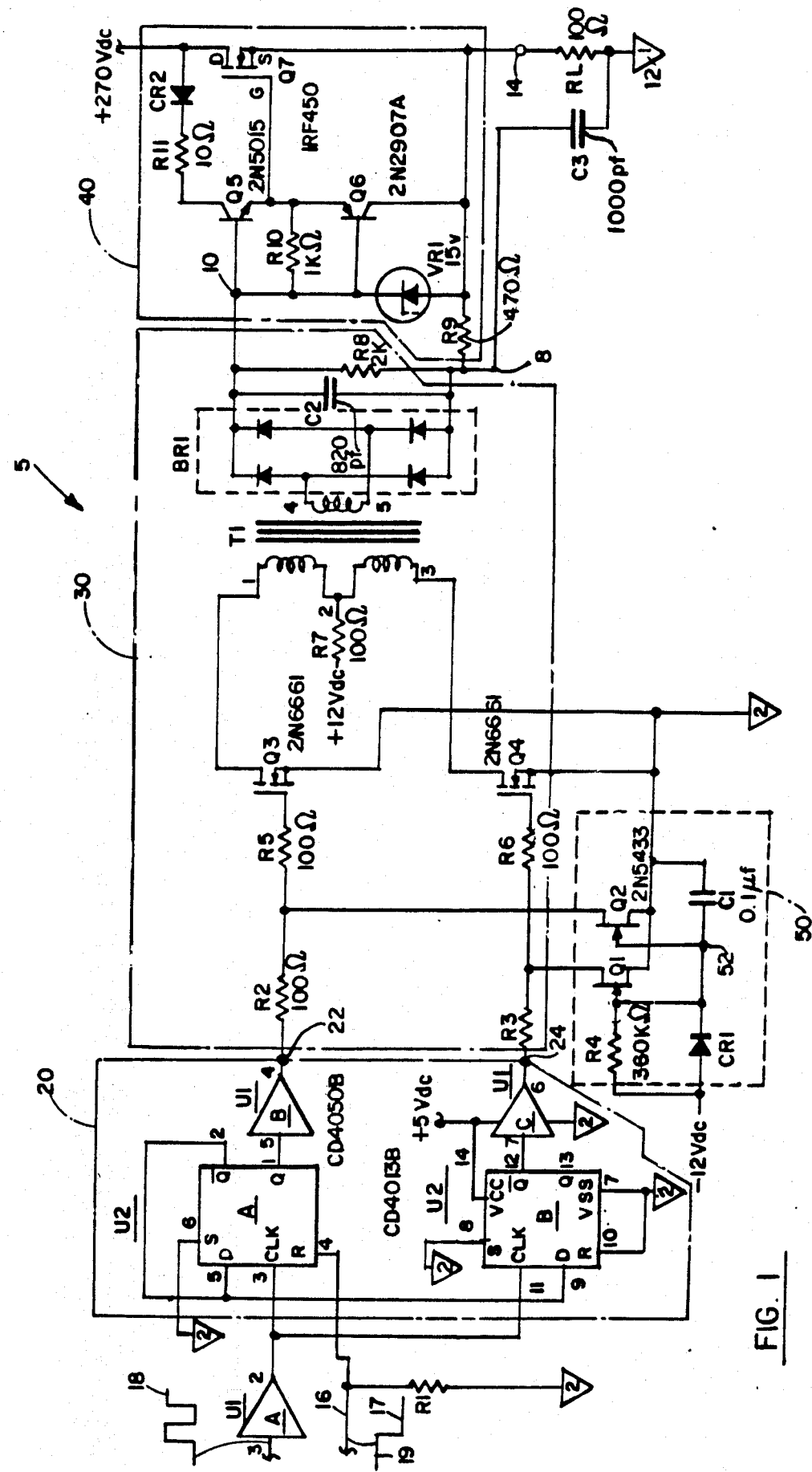
FIG. 1 is a schematic of the solid state dc power switch circuit.

FIG. 1 is a schematic of the invention solid state dc switch circuit 5 for switching power from the positive terminal of a ground referenced dc voltage source, such as the +270Vdc source referenced to ground 12. The solid state dc switch, switches power 270Vdc source to the terminal 14 of a ground referenced load RL. The solid state dc switch 5 is responsive to a control signal, such as the ENABLE signal provided to D flip-flop input pin U2A-4. This waveform is better characterized in FIG. 3 as waveform (b). The control signal waveform (b) has a first and second state 312, 314 respectively. The control signal originates from a control signal source (not shown) on signal line 16 in FIG. 1. A cockpit switch transmitting a ground or zero V signal when true, and a +5Vdc signal when false, remote from the solid state power control switch, might constitute a typical control signal source. The invention solid state dc switch circuit actuates for a low signal input, i.e. zero volts as shown at 312 in waveform (b) in FIG. 3.

The invention solid state dc switch circuit is also responsive to a clock signal 18 via signal line 3. The clock signal is shown in greater detail in relation to the enable or control signal in FIG. 3 as waveform (a). The clock signal has a first and second state 316, 318 respectively. Referring to FIG. 1, integrated circuit U1A is a noninverting buffer device that buffers the clock signal to the inputs of the two D flip-flops U2A and U2B.

Figure 3:
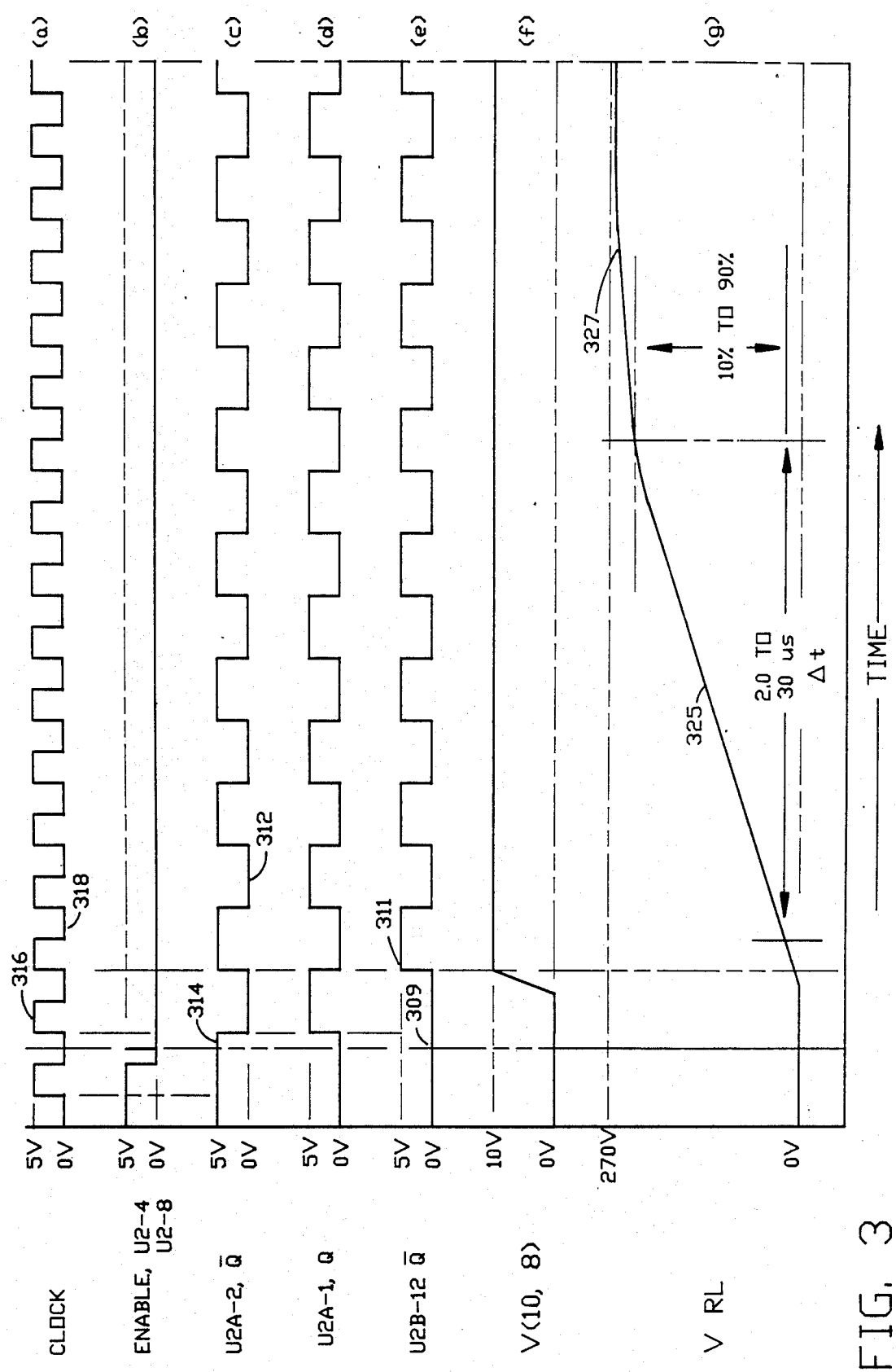
FIG. 3 is a timing chart of the solid state power controller.

The D flip-flop within phantom block 20 is a divide-by-two circuit means responsive to the clock signal 18 and to the control signal first state 17 for providing a first and second symmetrical output signal at the outputs of buffer devices U1B-4 and U1C-6 at a frequency of one-half the frequency of the clock frequency. The second symmetrical output signal at U1C-6 is delayed in time by one-half period from the first output signal at U1B-4. Referring to FIG. 3, waveforms (d) and (e) represent the symmetrical output signals at a frequency of one-half the frequency of the clock signal with the second symmetrical output signal, e.g., waveform (e) being delayed in time by one-half period from the first output signal. The divide-by-two circuit means 20 is responsive to the control signal second state 19 for interrupting the first and second symmetrical output signals.

The circuitry within phantom block 30 represents a transformer drive and rectifier means for providing an isolated dc signal, such as that represented by waveform (f) in FIG. 3 having a high state 320 in response to the first and second symmetrical signals, waveforms (d) and (e), and for providing an isolated dc signal low state 322 in response to interruption of the first and second symmetrical signals, waveforms (d) and (e), respectively.

The circuitry within phantom block 40 represents an isolated switching means responsive to the high state of the isolated dc signal, waveform (f), for coupling the positive terminal of the ground referenced dc voltage source, +270Vdc to the terminal 14 of the ground referenced load RL, and for decoupling the positive terminal of the ground referenced dc voltage source from the terminal 14 of the ground referenced load RL in response to the low state of the isolated dc signal depicted in FIG. 3 at 322.

Referring to FIG. 1, the isolated switching means of phantom block 40 is responsive to the change of state of the isolated dc signals from a low to a high state as characterized in FIG. 3, 322, 320, and for limiting the rate of rise of voltage on the load RL to a predetermined limit subsequent to the change of state. Referring to FIG. 3, waveform (g) represents the voltage on the load RL. The rate of rise is characterized as the change in voltage from the ten percent point to the ninety percent point that takes place over the interval of time shown as Δt.

Figure 2:
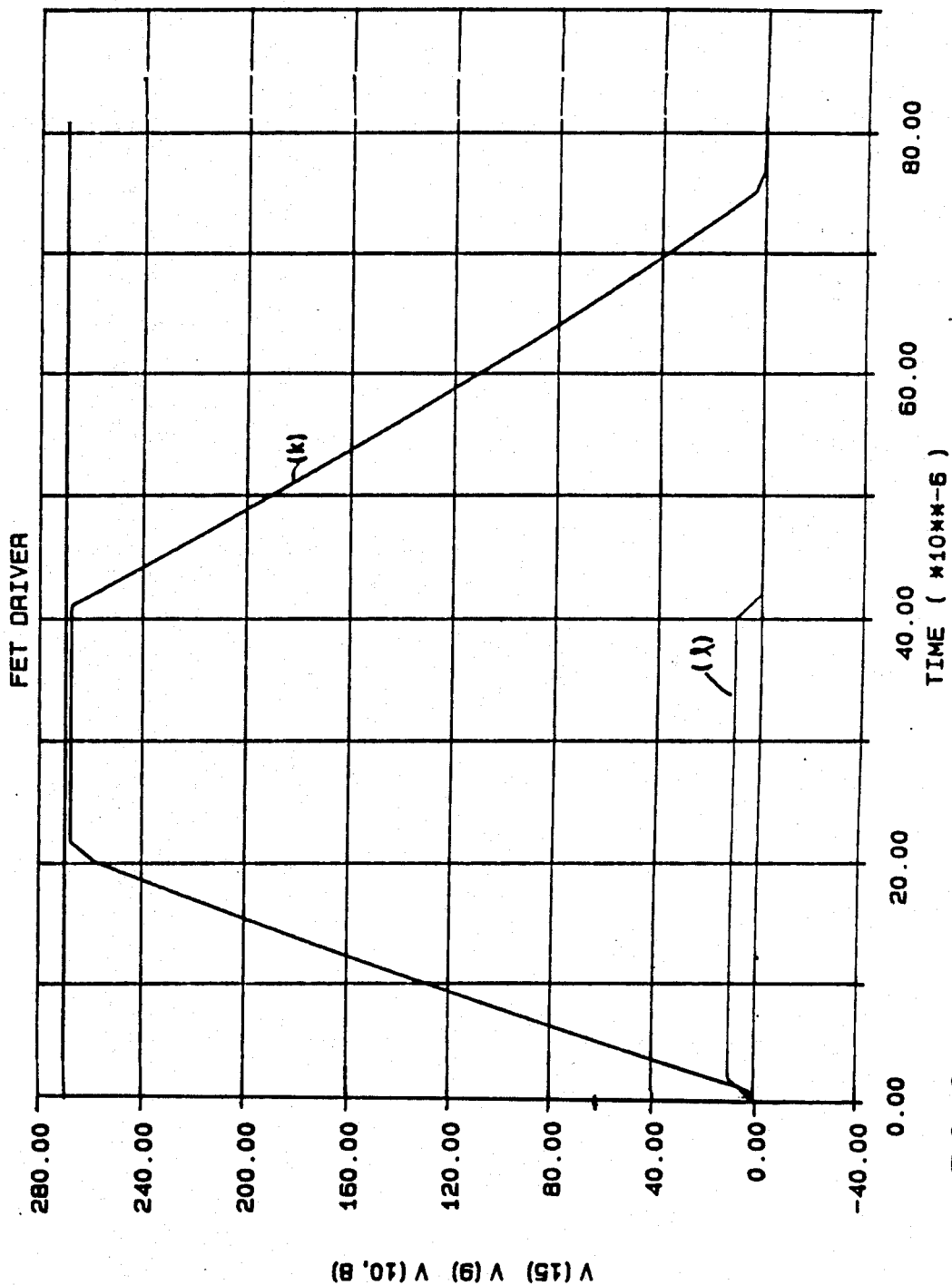
FIG. 2 is a graph of the input and output response characteristics of the solid state dc power switch.

The isolated switching means is responsive to the change of state of the isolated dc signal, waveform (f), from a high state 320 to a low state 322 for limiting the rate of fall of voltage on the load subsequent to the change of state of the isolated dc signal from a high state to a low state. This response characteristic is not depicted in FIG. 3; however, FIG. 2 characterizes the controlled rate of fall of voltage on the load RL for the simplified circuit for analysis depicted in FIG. 4. Referring to FIG. 2, waveform (k) experiences a rate of fall from 41 microseconds to completion at approximately 75 microseconds. This fall results from a drop in the isolated dc signal of FIG. 5, V (10, 8), which represents the voltage at node 10 with respect to node 8 of FIG. 4 from source 412. FIG. 5 shows the fall of the input signal, waveform (1), starting at 40 microseconds and ending at approximately 42 microseconds. FIG. 2 shows waveform (1) from FIG. 5 superimposed in real time.

Referring to FIG. 1, the divide-by-two circuit means of phantom block 20 comprises a first and second flip-flop, such as D flip-flop U2A and U2B. Each flip-flop has a Q and and Q' output such as pins 1 and 2 for U2A and such as pins 13 and 12 for U2B. Each flip-flop has a set input such as U2A-6 and U2B-8, a reset input such as U2A-4 and U2B-10 and a D input such as U2A-5 and U2B-9. The clock input of each flip-flop is coupled to the clock signal source U1A-2. The Q' output of the first flip-flop, U2A-2, is coupled to the D inputs of the first and second flip-flops. The control signal is coupled to the reset input of the first flip-flop, U2A-4.

The first and second symmetrical output signals are provided at the Q output of the first flip-flop, U2A-1, and at the Q' output of the second flip-flop, U2B-12, respectively. The first and second symmetrical output signals are sequentially forced to a low state in response to the control signal second state, i.e. as the control signal (ENABLE) goes from a low to a high state. The high, or +5 V, control signal input to U2A-4 forces the Q' output at U2A-2 to a logic 1. This signal into U2B-9 input forces the Q' output of the U2B flip-flop on the following clock, i.e., U2B-12 to a low state. U1B and U1C are noninverting buffer devices such as the CD4050 CMOS integrated circuit. U2A and U2B are typically CMOS CD4013-type devices. As the control signal (ENABLE) drops from a +5 V level to a 0 V level, the U2A and U2B flip-flops are free to respond to the clock signal inputs to the flip-flops at U2A-3 and U2B-11. FIG. 3 shows the clock signal at (a) having a high state of +5 V at 316 and a low state of 0 V at 318. The D flip-flops used in the application of FIG. 1 respond to the clock signal as the clock signal transitions from a low state to a high state only.

Once the control signal, (b), transitions from a high state to a low state, outputs of U2A-1 and U2B-12 begin to cycle and to complement each other. Clock (a) need not be symmetrical. Signals (d) and (e) are symmetrical since the flip-flops respond with state changes only as the clock signal transitions from a low to a high. The clock transitions from a low to a high occur only once in each clock cycle and, therefore, occur at uniform intervals of time, thereby providing for uniform responses from the flip-flop outputs. The D inputs to flip-flops U2A and U2B receive the output from U2A-2. Flip-flop U2B, therefore, copies the output of the U2A-2 output delayed by one clock cycle and results in the apparent phase shift of (e) with respect to (d).

Referring to FIG. 1, the isolated switching means of phantom block 40 typically comprises a first semiconductor switching device such as FET Q7. FET Q7 is typically a IRF 450. FET Q7 has a conduction channel that has a first and second terminal, such as its drain and source D, S and a control terminal such as its gate G. The conduction channel first terminal D is coupled to the positive terminal of the ground referenced dc voltage source, i.e. +270Vdc. The conduction channel second terminal S is coupled to the terminal 14 of the ground referenced load RL. The base-to-emitter junction of Q5 represents a means for coupling the first semiconductor switching device control terminal G to the isolated dc signal at node 10. The first semiconductor switching device conduction channel is driven into conduction, i.e., the FET is turned on, in response to the isolated control signal assuming a first state as depicted in FIG. 3 at 320.

The semiconductor switching means has a capacitor, such as C3, having a first terminal coupled to node 8 and a second terminal coupled to the reference potential for the 270Vdc source, i.e., ground 1. A resistor having a first terminal is coupled to the capacitor terminal at 8 and a second terminal of the resistor is coupled to the terminal of the ground reference load at 14. The transformer drive and rectifier means within phantom block 30 has an output terminal coupled to node 10 and a return terminal coupled to node 8. The transformer drive and rectifier means provides an isolated dc signal having a high state such as 10 V shown as (f) in FIG. 3 and also state of 0 V shown in the same Figure. Waveform (f) is titled V(10,8). This title V(10,8) indicates that the voltage at node 10 is measured with respect to the voltage at node 8.

The transformer drive and rectifier means output terminal is coupled to the semiconductor switching means control terminal, such as the gate of Q7, via the base to emitter junction of Q5. The transformer drive and rectifier means output return terminal is coupled to the resistor first terminal at node 8. The rate of output voltage rise and fall at the terminal of the ground reference load, 14, is substantially proportional in time to the product of the resistor resistance and the capacitor capacitance. For example, FIG. 2 shows the rise in voltage at terminal 14 with respect to ground 1 that results when the capacitor C3 is set equal to 1,000pF and the value of R9 is set equal to 470 ohms.

Referring to FIG. 1, the circuitry within phantom block 50 represents a turn-on delay means. This circuit operates by preventing switching FETS Q3 and Q4 from receiving the symmetrical drive signals for a predetermined time after the system is powered up. As the system is turned on, the low voltage levels, such as the +5Vdc supply, the +12Vdc supply and the −12Vdc supply, rise and move into their regulated ranges at different times. There is no assurance that they will all be within the required regulations range at the same time. J-FETS Q1 and Q2 operate as shorting paths or shunt paths to ground 2. Each J-FET has a conduction channel that is normally on or conducting. A negative voltage must be developed at the gate of these N-channel J-FETS to turn these JFETS off. Resistor network R2 and R5 couple the output of the first symmetrical drive signal to the gate of FET Q3 and resistor R3 and R6 couple the second symmetrical drive signals to the gate of FET Q4. The first resistor network, R2 and R5, are shorted to ground at their common junction by operation of JFET Q2 at turn-on until JFET Q2 is turned off. Resistor network R3 and R6 are shorted at their common junction to ground 2 by JFET Q1 at turn-on until JFET Q1 is turned off. Even though symmetrical drive signals are present at the outputs of the divide-by-two circuit means 20, i.e., at terminals 22 and 24 respectively, no signal is allowed to reach the gates of FETS Q3 or Q4 until J-FETS Q1 and Q2 are turned off. The J-FETS are turned off by operation of the −12Vdc supply, charging C1 to −12Vdc at node 52 via R4 as the −12Vdc supply moves into its regulation range. Interruption of power that causes the −12Vdc supply to return to 0 V discharges capacitor C1 immediately through diode CR1, thereby always insuring the full delay as the system is again turned on.

OPERATION

The solid state dc switch is composed of several circuit functions. Referring to FIG. 1, the phantom block 20, together with phantom block 30, creates a switchable isolated dc source. The circuit within phantom block 50 provides a power-up/down inhibit function. And the circuitry shown within phantom block 40 performs the function of main power switch along with rise and fall time control. In FIG. 1, a dc-to-dc converter (phantom block 20 and 30) is controlled by a signal applied to line 16. A logically high (+5 Volts) signal represents an INHIBIT or OFF condition, and a logically low (0 Volt) signal represents an ENABLE, or ON, condition. This signal may be synchronous or asynchronous to the clock signal on line 3. A high signal on line 16 forces the flip-flop U2A into a reset, or zero set, state and ignores the signal at the D input (pin 5). This forces the Q' output (pin 2) of flip-flop U2A high, as shown in FIG. 3c, or Q output low, as shown in FIG. 3d. Since the Q' output is also connected to the D input (pin 9) of flip-flop U2B, the flip-flop U2B is clocked to a set or one state forcing a low, or zero, volt at Q' output (pin 12) of flip-flop U2B, as shown in FIG. 3e. A low signal at U2A-1 and U2B-12 is buffered by U1B and U1C respectively. The output from U1B drives the gate terminal of Q3, and U1C output drives the gate terminal of Q4. A zero volt signal on the gate terminals of Q3 and Q4 forces both Q3 and Q4 off. With no primary drive to transformer T1, the output at the bridge rectifier will also be zero volts, since the resistor R8 would have discharged capacitor C2. This output will also be referred to as V(10,8).

When a low signal is applied to line 16, flip-flop U2A will transfer the state of the D input to its output on the positive-going transition of the clock signal applied at pin 3. Similarly, flip-flop U2B will copy the state of the D input (pin 9) to its output. Refer to FIGS. 3d and 3e for the resulting output signal. These signals will alternately drive Q3 and Q4 via buffer devices U1B and U1C on, then off. A square wave signal will appear at the secondary winding (terminal 4 and 5) of transformer T1. The full-wave bridge rectifier, BR1, will convert the square wave to a dc voltage at node 10 with respect to node 8. Capacitor C2 eliminates the transition spikes. When the ENABLE signal again returns to +5 volts, the output voltage V(10,8) returns to zero volts through resistor R8. The unique manner in which the flip-flops are connected insures that Q4 was ON last, which resets the magnetic state of transformer T1, reducing the possibility of transformer saturation. The flip-flop connection also provides a symmetrical transformer drive to prevent transformer saturation. Referring to FIG. 1, the circuitry shown in phantom block 50 prevents temporary turn-on of output switch Q7 during power turn-on and turn-off. During power turn-on and turn-off, flip-flops U1A and U1B are in an unknown state. Q1 and Q2 are normally-on devices and will override the signals appearing at the gates of Q3 and Q4 by way of U1B and U1C during power-on and power-off conditions. When power to flip-flops U2A and B reaches a stable, acceptable level, and the control signal 16 is high, the flip-flop outputs will always be in a predetermined state. The override capability of Q1 and Q2 is no longer needed at this time. The duration during which Q1 and Q2 will maintain control of Q3 and Q4 is determined by R4 and C1. The diode CR1 conducts current to discharge C1 during power turn-off for rapid override control.

In FIG. 1, the main power switch shown in phantom block 40 is turned on when a low on the ENABLE input, line 16, causes a dc voltage to appear between nodes 10 and node 8. This voltage is approximately +10 volts. It turns on the pre-driver Q5, and Q5 applies the voltage at node 10, less Vbe, to the gate terminal of Q7. At this instant of time, the voltage at node 8 is at zero volts due to capacitor C3. With a positive voltage on the gate of Q7, Q7 will turn on, allowing current to flow from the +270Vdc source through Q7 and the load RL. This will develop a voltage across feedback resistor R9 with a polarity that opposes V(10,8), reducing the apparent gate drive to Q7. Therefore, the current flowing through Q7 will be limited to the load current which the gate-to-source voltage will allow. This action limits the voltage appearing across resistor R9 to $$V(R9) = V(10,8) - Vbe(Q5) - Vgs(Q7)$$

where
V(R9) = Voltage across resistor R9
V(10,8) = Voltage node 10 with respect to node 8
Vbe(Q5) = Voltage base with respect to emitter of Q5
Vgs(Q7) = Voltage gate with respect to source of Q7.
For a limited range of load current, it can be assumed that the Vgs(Q7) and Vbe(Q5) is constant for the purposes of calculating the rate of voltage rise appearing across the load RL. With Vbe (Q5) and Vgs (Q7) constant, the voltage across R9 is constant, resulting in a constant current charging capacitor C3. When a capacitor is charged or discharged with a constant current source, the voltage across the capacitor will change linearly.

SPICE is a well-known circuit analysis program. Copies of SPICE can be obtained from:
The Electronic Engineering and Computer Sciences (EECS) Department
EECS Industrial Liaison Program
457 Cory Hall
University of California at Berkeley
Berkeley, Calif. 94720
for a nominal charge, as well as from commercial sources.

Figure 4:
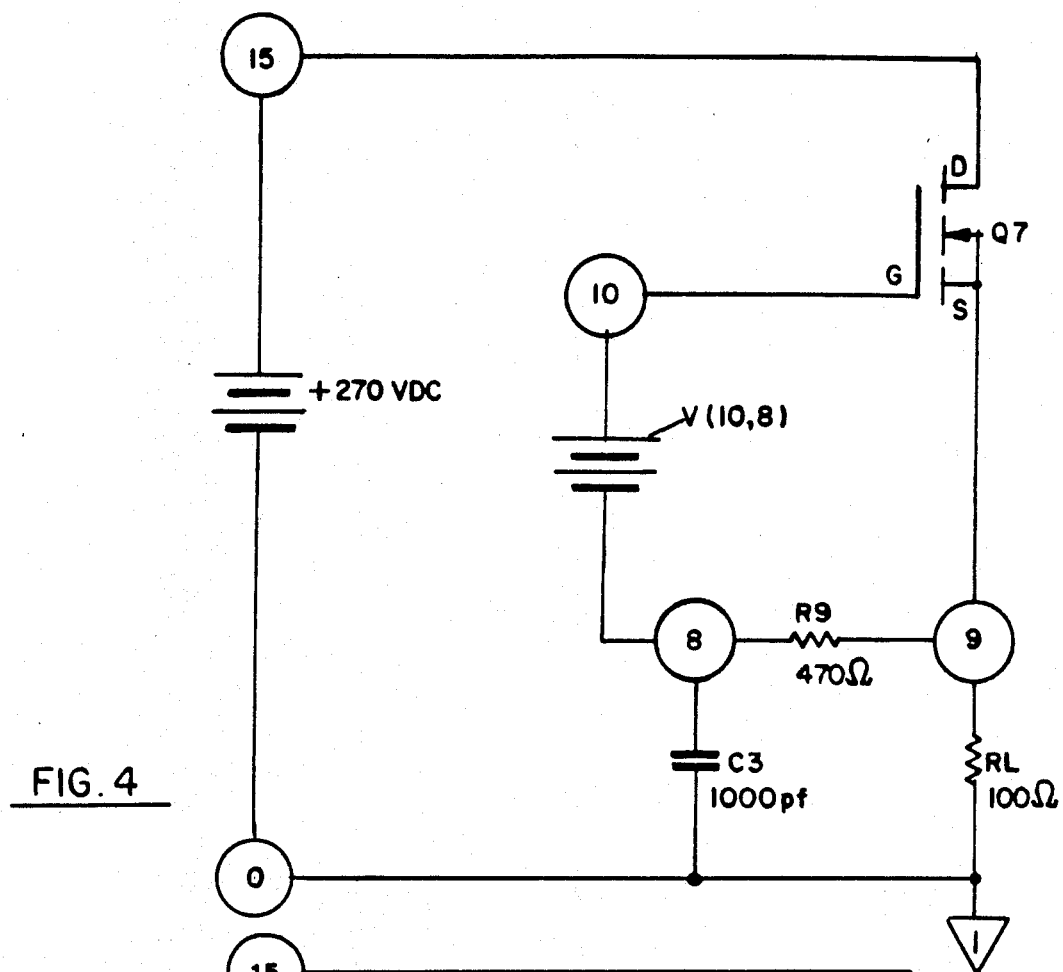
FIG. 4 is a simplified schematic of the active elements for rate control of the solid state power switch circuit.
Figure 5:
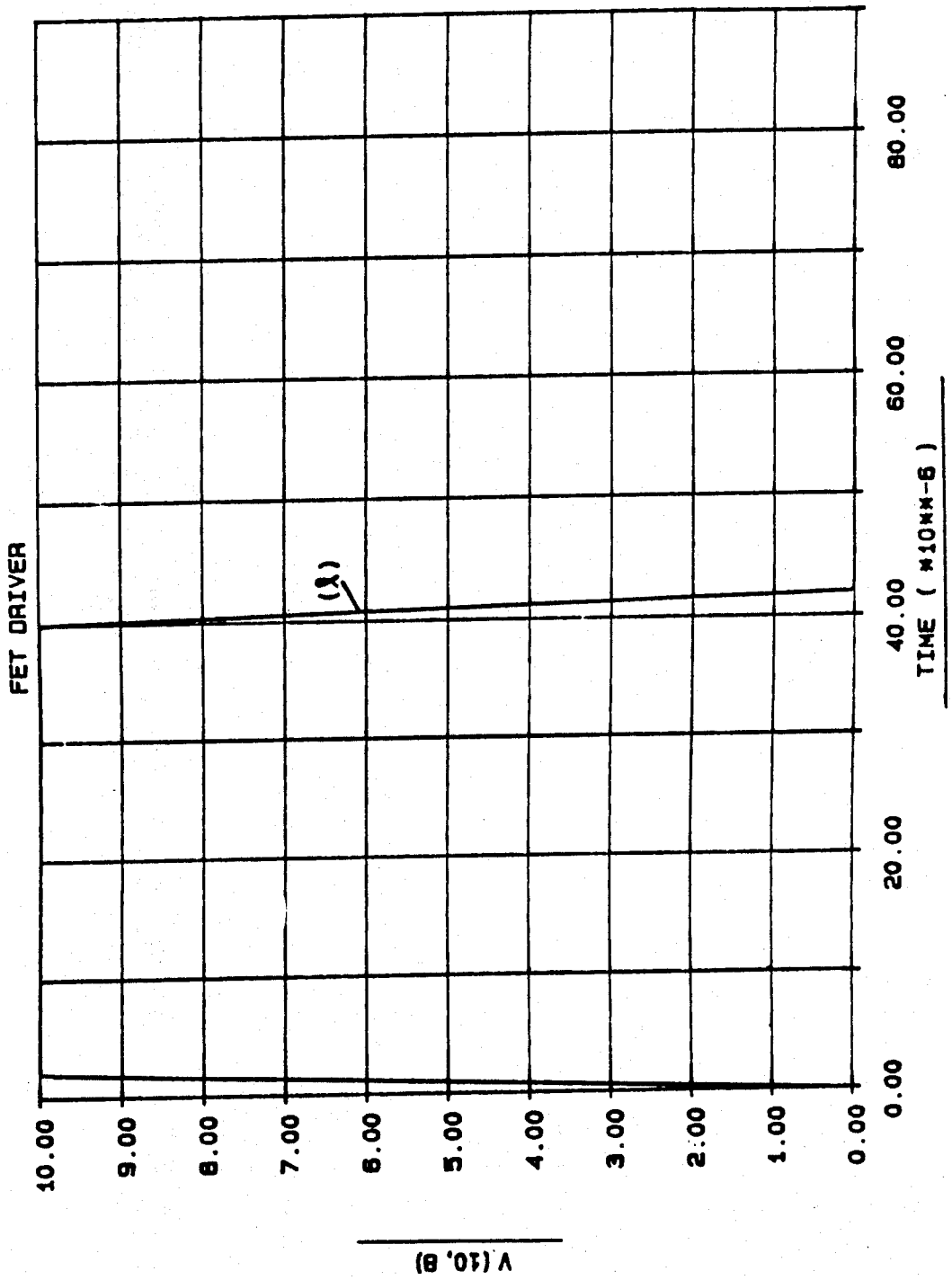
FIG. 5 is a graph of the voltage of the solid state dc power switch.
Figure 6:
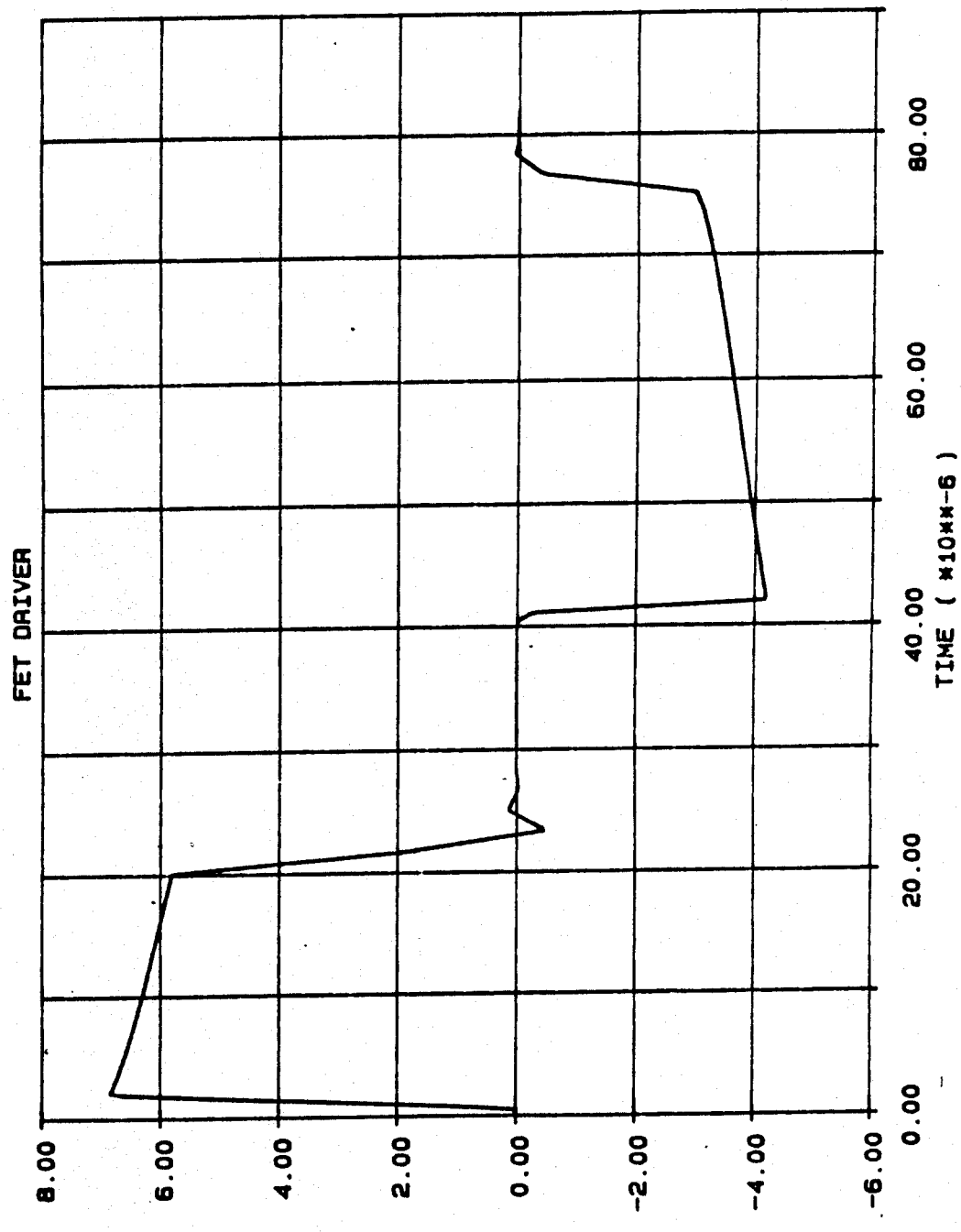
FIG. 6 is a graph of the voltage at node 9 with respect to node 8.

In FIG. 2d, the linear rate of rise and fall time shown is a result of SPICE circuit analysis, using the circuit model of FIG. 4. Without a computer, the approximate rise and fall time can be estimated using the following equations.

Rise
time = $(Vout90\% - Vout10\%) \times C3 \times R9/(V(10,8) - Vbe(Q5) - Vgs(Q7))$ Fall
time = $(Vout90\% - Vout10\%) \times C3 \times R9/(-Vbe(Q6) - Vgs(Q7))$ where
Vout90% = Magnitude of output voltage at 90% point in volts
Vout10% = Magnitude of output voltage at 10% point in volts
C3 = Value of capacitor C3 in farads
R9 = Value of resistor R9 in ohms
V(10,8) = Magnitude of voltage at node 10 with respect to node 8 in volts Vbe(Q5) = Base to emitter voltage of Q5 in volts
Vgs(Q7) = Gate to source threshold voltage of Q7 in volts
Vbe(Q6) = Base to emitter voltage of Q6 in volts During the rise time, Q5 buffers node 10 from the gate terminal of Q7 and, when Q5 saturates, diode CR2 will become reverse-biased, allowing the gate terminal of Q7 to be raised above the +270Vdc source through base to emitter diode of Q5 and, finally, through R10, due to V(10,8). And, during the fall time, Q6 buffers node 10 from the gate terminal of Q7. The zener diode VR1 prevents excessive gate-to-source voltage during a fault condition, such as an accidental short of output terminal to ground 1.

Figure 4A:
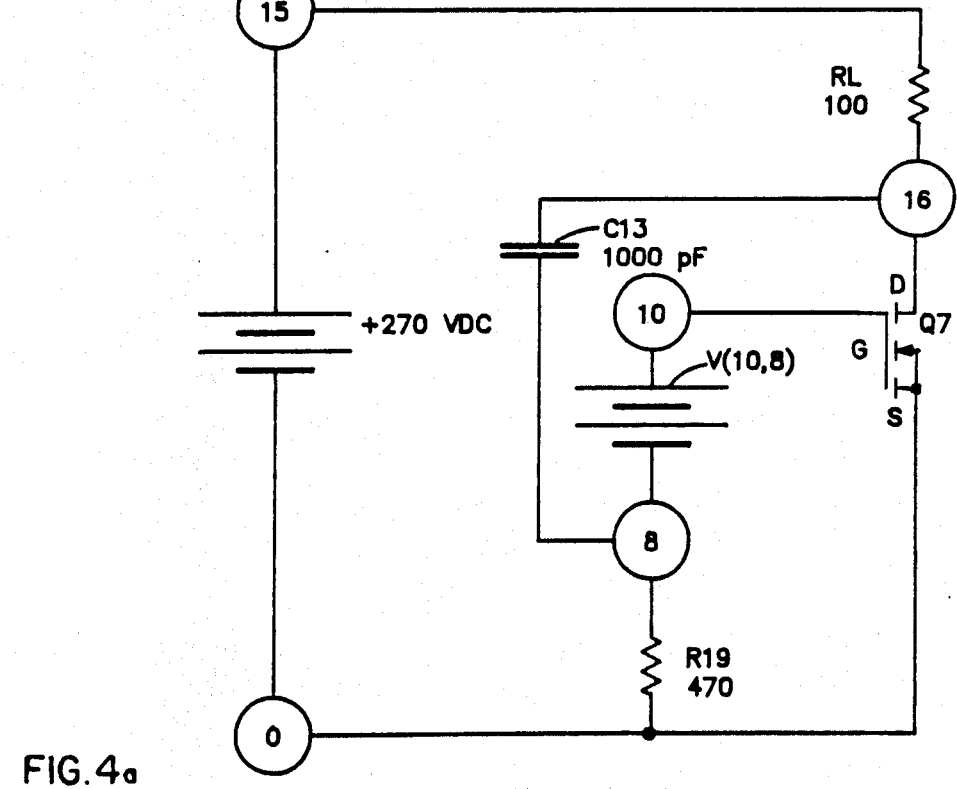
FIG. 4a is an alternative embodiment switch circuit configuration for use between the load RL and ground.
Figure 8:
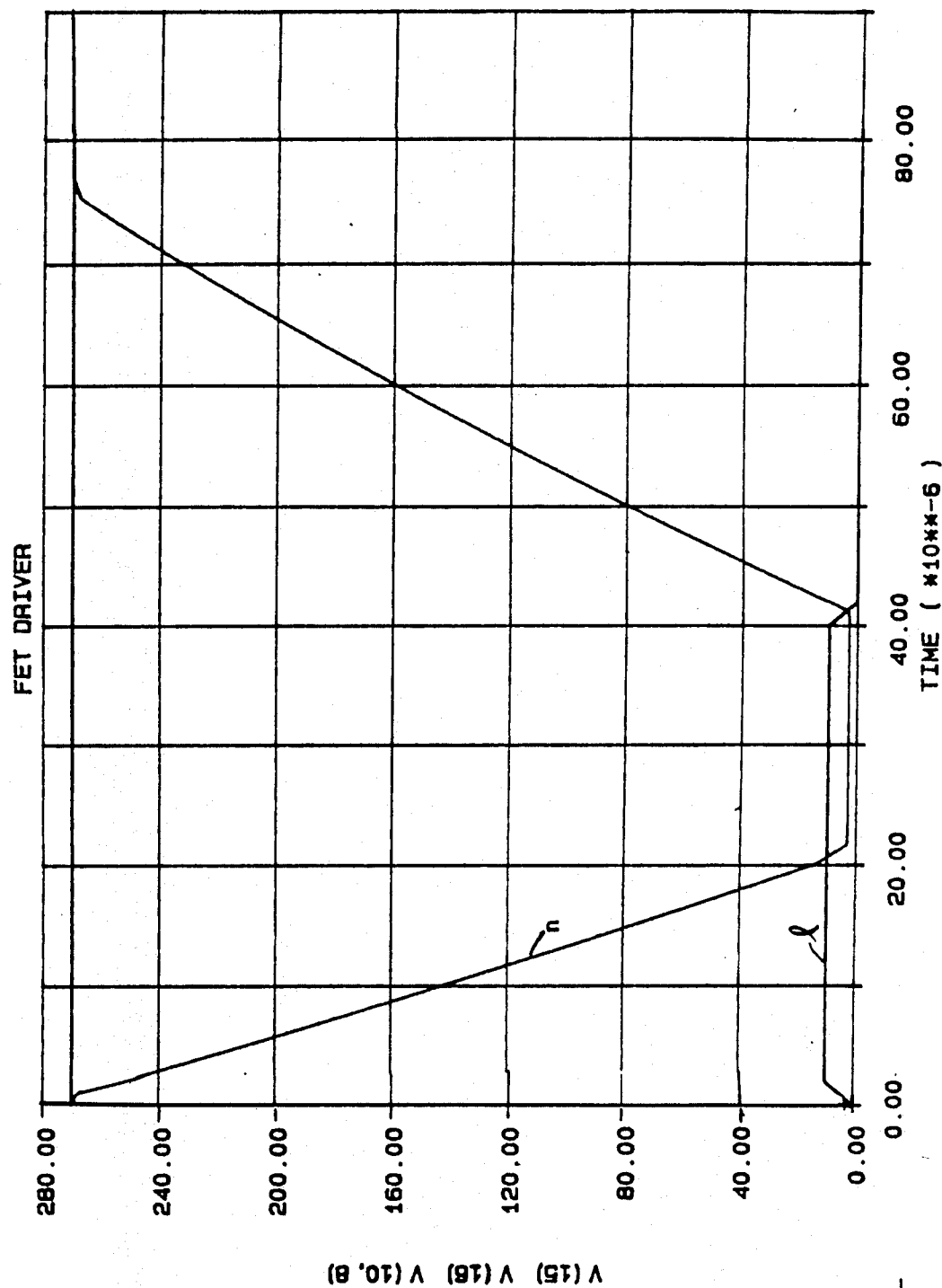
FIG. 8 is the voltage waveform across RL in the circuit of FIG. 4 measured at node 16 with respect to node 0.

FIG. 8 is a result of a SPICE circuit analysis using the circuit model of FIG. 4a. FIG. 4a is an alternative embodiment to the invention circuit of FIG. 4. The circuit of model of FIG. 4a permits insertion of the switching function between the load resistor RL at node 16 and ground 1 at node 0. This alternative circuit configuration is typically avoided because it causes the load to remain at high voltage when the switch is open. This configuration is not desirable because it creates a safety hazard and is typically avoided; however, the circuit of FIG. 4a illustrates a way of mechanizing or fabricating the invention configuration of FIG. 4 to allow insertion of the switch between the load and ground 1.

Figure 7:
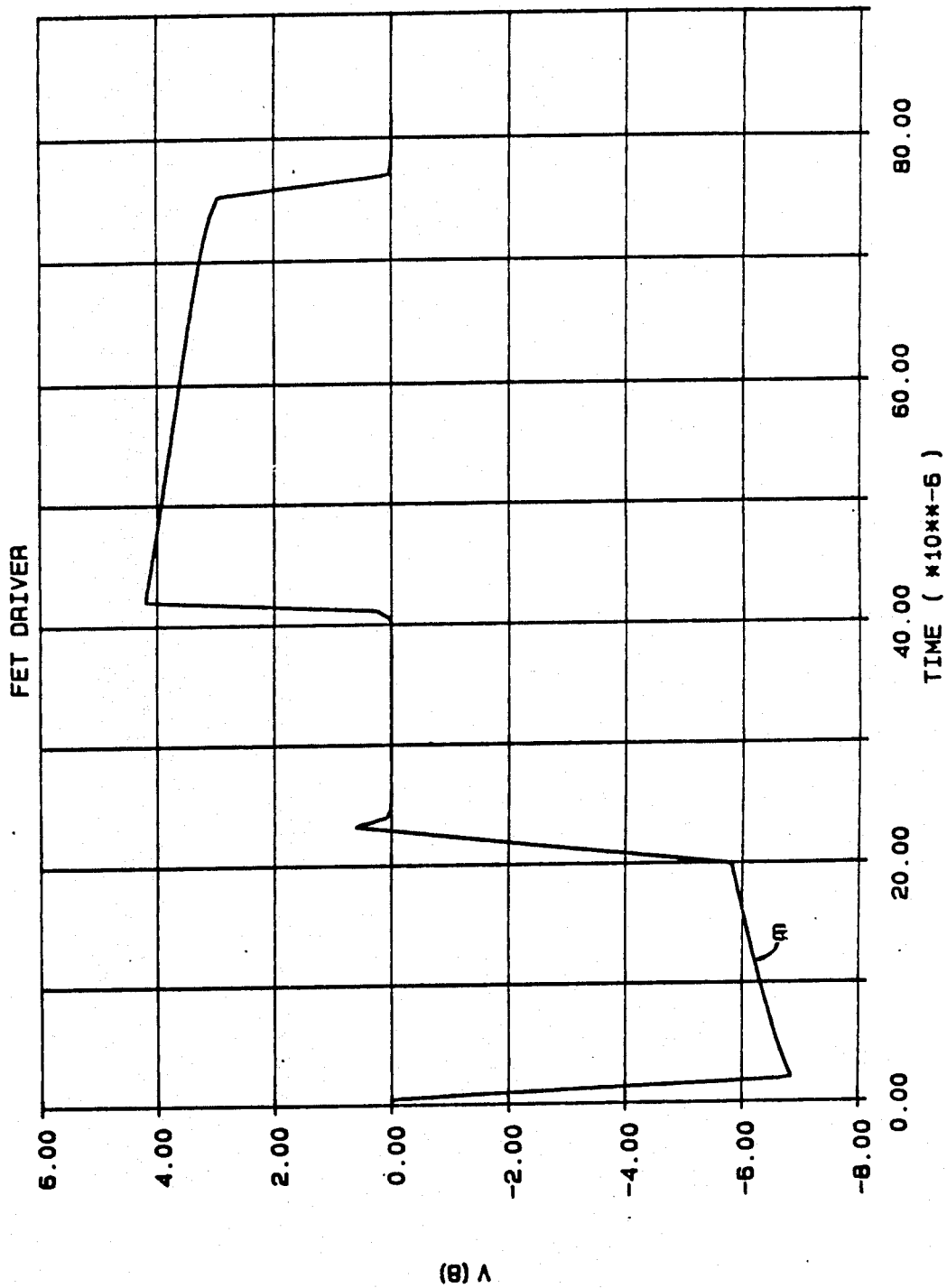
FIG. 7 is the voltage waveform across R19 in the circuit of FIG. 4a measured at node 8 with respect to node 0.

FIG. 7 is the voltage waveform that occurs across resistor R19 at node 8 with respect to node 0. The initial transition of voltage at node 8 is negative. This transition results form the fact that the capacitor is charged to 270 volts between node 16 and node 8. As switch Q7 turns on by the source between node 10 and node 8, represented by the waveform of FIG. 5, the voltage at node 16 moves in a negative direction, thus driving node 8 below ground. As the voltage at node 8 moves below ground, the voltage at node 10 also drops, forcing Q7 to limit its conductivity. The circuit operates to achieve a relatively constant voltage across R19, that voltage being equal to the voltage of the source at node 10 with respect to node 8, less the Vgs of FET Q7. The substantially constant voltage across R19 is depicted in FIG. 7 during the interval from approximately 2 microseconds to 20 microseconds. Referring to FIG. 8, the rate of fall of node 16 with respect to node 0 is characterized by waveform n. Wave form 1 is superimposed to show the time relationship between the driving signal, characterized by FIG. 5, i.e., also waveform 1, and the voltage at node 16 with respect to node 0.

In conclusion, the same capacitor values are used for C3 and for C13, and the same resistor values are used for R9 and R19 in FIG. 4 and FIG. 4a, respectively. Substantially the same rates of voltage rise and voltage fall are observed for each of the two circuit configurations.

I claim:
1. A solid state dc switch for switching power from a positive terminal of a ground referenced dc voltage source to a terminal of a ground referenced loaded, said solid state dc switch being responsive to a control signal having a first and second state from a control signal source and also responsive to a clock signal from a clock signal source,
said clock signal having a first and second state, said solid state dc switch comprising:
divide-by-two circuit means coupled to said control signal source and to said clock signal source, said divide-by-two circuit means being being respon- sive to said clock signal and to said control signal first state for providing a first and second symmetrical output signals at a frequency of one-half the frequency of said lock frequency, said second symmetrical output signal being delayed in time by one-half period from said first output signal; said divide-by-two circuit means being reponsive to said control signal second state for interrupting said first and second symmetrical output signals;

transformer drive and rectifier means coupled to receive said first and second symmetrical output signals from said divide-by-two circuit means, said transformer drive and rectifier means being responsive to said first and second symmetrical output signals for providing an isolated dc signal having a high state in response to said first and second symmetrical output signals and for providing an isolated dc signal low state in response to interruption of said first and second symmetrical signals output;

an isolated switching means coupled to receive said isolated dc signal from said transformer drive and rectifier means said isolated switching means being responsive to said high state of said isolated dc signal for coupling said positive terminal of said ground referenced dc voltage source to the terminal of said ground referenced load, and for decoupling said positive terminal of said ground reference dc voltage source from the terminal of said ground referenced load in response to the low state of the isolated dc signal.

2. The solid state dc switch of claim 1 wherein said isolated switching means responsive to said high state of said isolated dc signal for coupling said positive terminal of said ground referenced dc voltage source to the terminal of said ground referenced load, and for decoupling said positive terminal of said ground referenced dc voltage source from the terminal of said ground referenced load further comprises:

a semiconductor switching means having a conduction channel having a first and second terminal and a control terminal, said conduction channel first terminal being coupled to said positive terminal of said ground referenced voltage source, said second terminal being coupled to the terminal of said ground referenced load, said control terminal being coupled to said isolated dc signal; and a means responsive to the change of state of said isolated dc signal from a low to a high state for limiting the rate of rise of voltage on said load to a predetermined limit subsequent to said change of state and for being responsive to the change of state of said isolated dc signal from a high state to a low state for limiting the rate of fall of voltage on said load subsequent to said change of state of said isolated dc signal from a high state to a low state.

3. The solid state dc switch of claim 2 wherein said means responsive to the change of state of said isolated dc signal from a low to a high state for limiting the rate of rise of voltage on said load to a predetermined limit subsequent to said change of state; and for being responsive to the change of state of said isolated dc signal from a high state to a low state for limiting the rate of fall of voltage on said load subsequent to said change of state of said isolated dc signal from a high state to a low state further comprises:

a capacitor having a first terminal and a grounded terminal;

a resistor having a first terminal coupled to said capacitor and a second terminal coupled to the terminal of said ground referenced load; and, wherein:

said transformer drive and rectifier means for providing an isolated dc signal having high state in response to said first and second symmetrical signals and for providing an isolated dc signal low state in response to interruption of said first and second symmetrical signal provides said isolated dc signal at an output terminal with respect to an output return terminal;

said transformer drive and rectifier means output terminal being coupled to said semiconductor switching means control terminal and said transformer drive and rectifier means output return terminal being coupled to said resistor first terminal; said rate of output voltage rise and fall at said terminal of said ground referenced load being substantially proportional in time to the value of the product of said resistor resistance and said capacitor capacitance.

4. The solid state dc switch of claim 1 wherein said divide-by-two circuit means further comprises:

a first and second flip-flop, each flip-flop having a Q and a Q' output, a set input, a reset input and a D input;

the clock input of each flip-flop being coupled to said clock signal source;

the Q' output of said first flip-flop being coupled to the D inputs of said first and second flip-flops;

said control signal being coupled to reset input of said first flip-flop;

said first and second symmetrical output signals being provided at the Q output of said first flip-flop and at the Q' output of said second flip-flop, respectively;

whereby, said first and second symmetrical output signals are sequentially forced to a low state in response to said control signal second state.

5. The solid state dc switch of claim 1 wherein said isolated switching means responsive to said high state of said isolated dc signal for coupling said positive terminal of said ground referenced dc voltage source to the terminal of said ground referenced load, and for decoupling said positive terminal of said ground referenced dc voltage source from the terminal of said ground referenced load further comprises:

a first semiconductor switching device having a conduction channel having a first and second terminal and a control terminal, said conduction channel first terminal being coupled to said positive terminal of said ground referenced dc voltage source and said conduction channel second terminal being coupled to said terminal of said ground referenced load;

a means for coupling said first semiconductor switching device control terminal to said isolated dc signal, whereby said first semiconductor switching device conduction channel is driven into conduction in response to said isolated dc control signal assuming a first state.

6. The solid state dc switch of claim 1 wherein said transformer drive and rectifier means for providing an isolated dc signal having high state in response to said first and second symmetrical signals and for providing an isolated dc signal low state in response to interruption of said first and second symmetrical signal further comprises:
- a transformer having a primary having first and second end terminals and said primary having a center-tap terminal and a secondary coupled to a voltage source referenced to ground;
- a switching means responsive to said first and second symmetrical drive signals for switching said transformer primary opposing end terminals alternately to ground to produce an ac signal across said primary secondary;
- a rectifier and filter means coupled to said transformer secondary for rectifying and filtering said ac signal to provide said isolated dc signal high state.

7. The solid state dc switch of claim 6, wherein said switching means responsive to said first and second symmetrical drive signals for switching said transformer primary opposing end terminals alternately to ground to produce an ac signal across said primary, further comprises:
- first and second FET switches, each FET switch having a drain, a source, and a gate terminal, said first and second FET gates being coupled to said first and second symmetrical signals, respectively, and said first and second FET source terminals being coupled to ground, and said first and second FET drain terminals being respectively coupled to respective transformer opposing terminals.

8. A solid state dc switch for switching power from a positive terminal of a ground referenced dc voltage source to a terminal of a ground referenced load, said solid state dc switch being responsive to a control signal having a first and second state from a control signal source and also responsive to a clock signal from a clock signal source, said clock signal having a first and second state, saids solid state dc switch comprising:
- divided-by-two circuit means coupled to said control signal source and to said clock signal source, said divide-by two circuit means being responsive to said clock signal and to said control signal first state for providing first and second symmetrical output signals at a frequency of one-half the frequency of said clock frequency, said second symmetrical output signal being delayed in time by one-half period from said first output signal, said divide-by-two circuit means being responsive to said control signal second state for interrupting said first and second symmetrical output signals;
- transformer drive and rectifier means having an output terminal and a return terminal, said transformer drive and rectifier means being coupled to receive said first and second symmetrical output signals from said divide-by-two circuit means, said transformer drive and rectifier means being responsive to said first and second symmetrical output signals providing an output terminal with respect to a return terminal an isolated dc signal having high state in reponse to said first and second symmetrical output signals and for providing an isolated dc signal low state in response to interruption of said first and second symmetrical output signals;
- a semiconductor switching means having a conduction channel having a first and second terminal and a control terminal, said conduction channel first terminal being coupled to said positive terminal of said ground referenced voltage source, said second terminal being coupled to the terminal of said ground referenced load, said control terminal being coupled to said isolated dc signal;
- a capacitor having a first terminal and a grounded terminal;
- a resistor having a first terminal coupled to said capacitor and a second terminal coupled to the terminal of said ground referenced load, said transformer drive and rectifier means output terminal being coupled to said semiconductor switching means control terminal, and said transformer drive and rectifier means output return terminal is coupled to said resistor first terminal, said rate of output voltage rise and fall at said terminal of said ground referenced load being substantially proportional in time to the value of the product of said resistor resistance and said capacitor capacitance.

9. The solid state dc switch of claim 8 wherein said divide-by-two circuit means further comprises:
- a first and second flip-flop, each flip-flop having a Q and a Q' output, a set input, a reset input and a D input, the clock input of each flip-flop being coupled to said clock signal source and the Q' output of said first flip-flop being coupled to the D inputs of said first and second flip-flops; and
- a turn-on delay means for interrupting said first and second symmetrical drive symbols to said transformer drive and rectifier means during the initial power-up interval until a predetermined power supply voltage level exceeds a predetermined limit.

* * * * *